United States Patent
Kao et al.

(10) Patent No.: US 11,107,767 B2
(45) Date of Patent: *Aug. 31, 2021

(54) STRUCTURE FOR STANDARD LOGIC PERFORMANCE IMPROVEMENT HAVING A BACK-SIDE THROUGH-SUBSTRATE-VIA

(71) Applicant: Taiwan Semiconductor Manufacturing Co., Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Hsun-Ying Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,271

(22) Filed: Dec. 11, 2019

(65) Prior Publication Data

US 2020/0161244 A1 May 21, 2020

Related U.S. Application Data

(63) Continuation of application No. 16/176,547, filed on Oct. 31, 2018, now Pat. No. 10,566,288, which is a
(Continued)

(51) Int. Cl.
*H01L 23/538* (2006.01)
*H01L 23/48* (2006.01)
(Continued)

(52) U.S. Cl.
CPC ...... *H01L 23/5384* (2013.01); *H01L 21/6835* (2013.01); *H01L 21/76804* (2013.01);
(Continued)

(58) Field of Classification Search
CPC . H01L 23/5384; H01L 23/481; H01L 23/522; H01L 21/76804; H01L 21/76898;
(Continued)

(56) References Cited

U.S. PATENT DOCUMENTS

| | | | |
|---|---|---|---|
| 7,354,798 B2 | 4/2008 | Pogge et al. | |
| 8,158,489 B2 | 4/2012 | Huang et al. | |

(Continued)

FOREIGN PATENT DOCUMENTS

| | | |
|---|---|---|
| JP | 2006203139 A | 8/2006 |
| JP | 2006210758 A | 8/2006 |
| JP | 2014003081 A | 1/2014 |

OTHER PUBLICATIONS

Non-Final Office Action dated Nov. 3, 2016 for U.S. Appl. No. 15/143,950.
(Continued)

*Primary Examiner* — Khiem D Nguyen
(74) *Attorney, Agent, or Firm* — Eschweiler & Potashnik, LLC

(57) ABSTRACT

In some embodiments, the present disclosure relates to an integrated chip. The integrated chip includes a first plurality of interconnect layers within a first inter-level dielectric (ILD) structure disposed along a front-side of a first substrate. A conductive pad is arranged along a back-side of the first substrate and a first through-substrate-via (TSV) extends between an interconnect wire of the first plurality of interconnect layers and the conductive pad. A second plurality of interconnect layers are within a second ILD structure disposed along a front-side of a second substrate that is bonded to the first substrate. A second through substrate via (TSV) extends through the second substrate. The second TSV has a greater width than the first TSV.

20 Claims, 9 Drawing Sheets

Related U.S. Application Data continuation of application No. 15/143,950, filed on May 2, 2016, now Pat. No. 10,147,682.

(60) Provisional application No. 62/260,808, filed on Nov. 30, 2015.

(51) Int. Cl.

| | | |
|---|---|---|
| *H01L 23/522* | (2006.01) | |
| *H01L 21/768* | (2006.01) | |
| *H01L 23/00* | (2006.01) | |
| *H01L 21/683* | (2006.01) | |
| *H01L 23/31* | (2006.01) | |
| *H01L 23/528* | (2006.01) | |
| *H01L 23/525* | (2006.01) | |

(52) U.S. Cl.
CPC .. *H01L 21/76832* (2013.01); *H01L 21/76883* (2013.01); *H01L 21/76898* (2013.01); *H01L 23/3171* (2013.01); *H01L 23/481* (2013.01); *H01L 23/522* (2013.01); *H01L 23/5283* (2013.01); *H01L 24/00* (2013.01); *H01L 24/02* (2013.01); *H01L 23/3114* (2013.01); *H01L 23/3192* (2013.01); *H01L 23/525* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 2221/6834* (2013.01); *H01L 2221/68327* (2013.01); *H01L 2224/0239* (2013.01); *H01L 2224/02313* (2013.01); *H01L 2224/02372* (2013.01); *H01L 2224/03002* (2013.01); *H01L 2224/0401* (2013.01); *H01L 2224/05008* (2013.01); *H01L 2224/05022* (2013.01); *H01L 2224/05073* (2013.01); *H01L 2224/05082* (2013.01); *H01L 2224/05569* (2013.01); *H01L 2224/05572* (2013.01); *H01L 2224/05624* (2013.01); *H01L 2224/05647* (2013.01); *H01L 2224/11002* (2013.01); *H01L 2224/131* (2013.01); *H01L 2224/13022* (2013.01); *H01L 2224/13024* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13183* (2013.01); *H01L 2224/16227* (2013.01); *H01L 2224/16245* (2013.01); *H01L 2224/81005* (2013.01); *H01L 2224/81815* (2013.01); *H01L 2924/01013* (2013.01)

(58) Field of Classification Search
CPC . H01L 2224/05624; H01L 2224/16227; H01L 21/76832; H01L 21/76883; H01L 23/3171; H01L 24/02; H01L 23/5283
See application file for complete search history.

(56) References Cited

U.S. PATENT DOCUMENTS

| | | | | |
|---|---|---|---|---|
| 8,264,077 B2* | 9/2012 | Chiou | ............... | H01L 24/05 257/698 |
| 8,860,229 B1* | 10/2014 | Lin | ............... | H01L 21/76897 257/774 |
| 8,872,310 B2 | 11/2014 | Cobbley et al. | | |
| 9,312,225 B2* | 4/2016 | Chang | ............... | H01L 21/6835 |
| 10,147,682 B2* | 12/2018 | Kao | ............... | H01L 23/5384 |
| 10,192,925 B2 | 1/2019 | Yokoyama et al. | | |
| 10,566,288 B2* | 2/2020 | Kao | ............... | H01L 21/76832 |
| 2004/0212086 A1 | 10/2004 | Dotta et al. | | |
| 2006/0281309 A1* | 12/2006 | Trezza | ............... | H01L 24/24 438/675 |
| 2010/0087029 A1* | 4/2010 | Fu | ............... | H01L 27/14689 438/70 |
| 2010/0090319 A1* | 4/2010 | Hsu | ............... | H01L 24/11 257/621 |
| 2010/0178761 A1 | 7/2010 | Chen et al. | | |
| 2011/0031618 A1* | 2/2011 | Yu | ............... | H01L 24/11 257/738 |
| 2011/0089572 A1 | 4/2011 | Tezcan et al. | | |
| 2011/0165776 A1* | 7/2011 | Hsu | ............... | H01L 23/481 438/667 |
| 2012/0132967 A1 | 5/2012 | Andry et al. | | |
| 2012/0133048 A1 | 5/2012 | Lee et al. | | |
| 2012/0139010 A1 | 6/2012 | Takeda | | |
| 2012/0193779 A1 | 8/2012 | Lee et al. | | |
| 2012/0193785 A1* | 8/2012 | Lin | ............... | H01L 24/97 257/737 |
| 2013/0040453 A1* | 2/2013 | Chen | ............... | H01L 21/6835 438/613 |
| 2013/0137222 A1 | 5/2013 | Yang et al. | | |
| 2013/0140690 A1 | 6/2013 | Lin et al. | | |
| 2013/0169355 A1* | 7/2013 | Chen | ............... | H01L 23/60 327/564 |
| 2013/0252416 A1 | 9/2013 | Takeda et al. | | |
| 2013/0307155 A1 | 11/2013 | Mitsuhashi | | |
| 2013/0321680 A1 | 12/2013 | Kumano | | |
| 2014/0048898 A1 | 2/2014 | Fei et al. | | |
| 2014/0110862 A1* | 4/2014 | Jeng | ............... | H01L 21/288 257/774 |
| 2014/0183693 A1* | 7/2014 | Tsai | ............... | H01L 23/5223 257/532 |
| 2014/0263975 A1 | 9/2014 | Nagano et al. | | |
| 2015/0021785 A1* | 1/2015 | Lin | ............... | H01L 25/0657 257/774 |
| 2015/0137360 A1* | 5/2015 | Lin | ............... | H01L 24/11 257/737 |
| 2015/0145116 A1* | 5/2015 | Uzoh | ............... | H01L 24/10 257/712 |
| 2015/0303108 A1* | 10/2015 | Kuo | ............... | H01L 21/28026 438/424 |
| 2016/0049371 A1* | 2/2016 | Lee | ............... | H01L 21/76831 257/621 |
| 2016/0172403 A1* | 6/2016 | Wu | ............... | H01L 27/1464 257/459 |

OTHER PUBLICATIONS

Final Office Action dated May 11, 2017 for U.S. Appl. No. 15/143,950.
Non-Final Office Action dated Sep. 21, 2017 for U.S. Appl. No. 15/143,950.
Final Office Action dated Mar. 21, 2018 for U.S. Appl. No. 15/143,950.
Notice of Allowance dated Jul. 20, 2018 for U.S. Appl. No. 15/143,950.
Non-Final Office Action dated Apr. 19, 2019 for U.S. Appl. No. 16/176,547.
Final Office Action dated Sep. 11, 2019 for U.S. Appl. No. 16/176,547.
Notice of Allowance dated Nov. 14, 2019 for U.S. Appl. No. 16/176,547.

* cited by examiner

STRUCTURE FOR STANDARD LOGIC PERFORMANCE IMPROVEMENT HAVING A BACK-SIDE THROUGH-SUBSTRATE-VIA

REFERENCE TO RELATED APPLICATIONS

This Application is a Continuation of U.S. application Ser. No. 16/176,547, filed on Oct. 31, 2018 (now U.S. Pat. No. 10,566,288, issued on Feb. 18, 2020), which is a Continuation of U.S. application Ser. No. 15/143,950, filed on May 2, 2016 (now U.S. Pat. No. 10,147,682, issued on Dec. 4, 2018), which claims the benefit of U.S. Provisional Application No. 62/260,808, filed on Nov. 30, 2015. The contents of the above-referenced Patent Applications are hereby incorporated by reference in their entirety.

BACKGROUND

Modern day integrated chips comprise millions or billions of semiconductor devices arranged within a semiconductor substrate (e.g., a silicon wafer). The semiconductor devices are connected to an overlying back-end-of-the-line (BEOL) metallization stack comprising a plurality of metal interconnect layers (e.g., wires and vias). The plurality of metal interconnect layers electrically connect the semiconductor devices to each other and to external components. Often the metal interconnect layers terminate at a bond pad located over the BEOL metallization stack. The bond pad may comprise a thick layer of metal that provides a conductive connection from the integrated chip to the external components (e.g., an integrated chip package).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
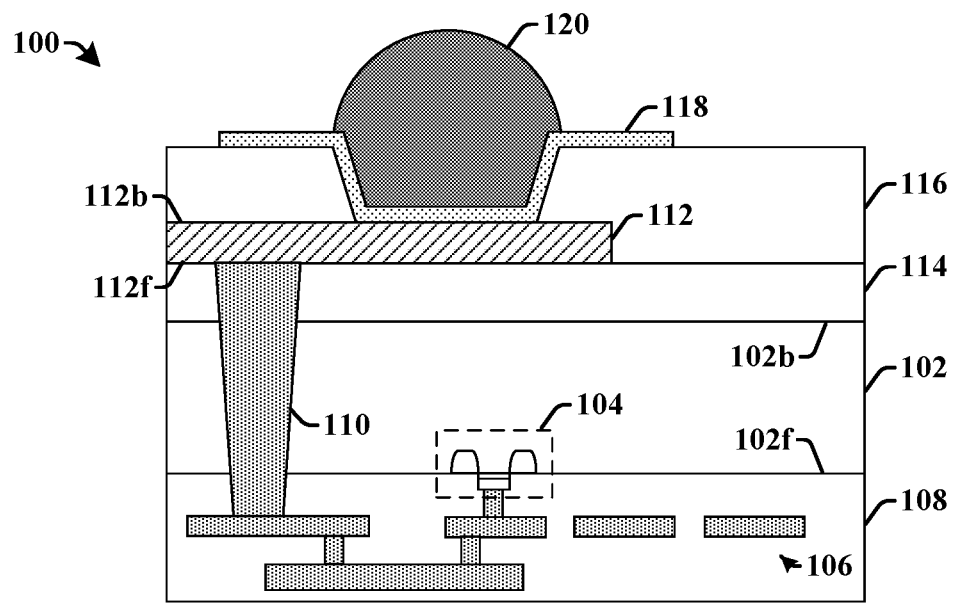
FIG. 1 illustrates some embodiments of an integrated chip having a back-side bond pad.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices within an integrated chip (IC) are connected to external circuitry (e.g., a package substrate) by way of a back-end-of-the-line (BEOL) metallization stack comprising a plurality of metal interconnect layers (e.g., wires and vias). The metal interconnect layers typically increase in size as a distance from a semiconductor substrate increases. For example, local interconnect wires having a relatively small size couple semiconductor devices within a semiconductor substrate to larger interconnect wires. The larger interconnect wires are further coupled to conductive bond pads, arranged along an upper surface of the BEOL metallization stack, which connect the IC to external circuitry.

Conductive bond pads are increasingly connected to external circuitry by way of flip-chip packages that utilize solder bumps to establish a direct electrical contact between the conductive bond pads and a package substrate (e.g., a printed circuit board). An IC having a flip-chip package includes a passivation layer comprising a plurality of openings extending to an underlying final (i.e., top) metal interconnect layer. A redistribution layer (RDL) is disposed on the passivation layer. The RDL may comprise a vertical component (i.e., a redistribution via (RV)) that extends from the final metal interconnect layer through an opening in the passivation layer to a lateral component. The lateral component re-distributes electrical signals from the final metal interconnect layer to a conductive bond pad overlying a polyimide pad arranged on the passivation layer, thereby enabling compatibility with different packaging options. An under bump metallurgy (UBM) layer is arranged onto the conductive bond pad, and serves as a solderable interface between the conductive bond pad and a solder bump. While the RDL enables a variety of different bond pad configurations, the RV has a large size (e.g., greater than 3 um) that results in a large conductive bond pad having a limited routing ability.

The present disclosure relates to an integrated chip (IC) having a back-side through-silicon-via (BTSV) with a direct physical connection between a metal interconnect layer and a back-side conductive bond pad, and a method of formation. In some embodiments, the integrated chip has a plurality of metal interconnect layers arranged within an inter-level dielectric (ILD) structure disposed onto a front-side of a substrate. A dielectric layer is arranged along a back-side of the substrate, and a conductive bond pad is arranged over the dielectric layer. A back-side through-substrate-via (BTSV) extends from one of the metal interconnect layers through the substrate and the dielectric layer to the conductive bond pad. A conductive bump is arranged onto the conductive bond pad, which has a substantially planar lower surface extending from over the BTSV to below the conductive bump. By using a conductive bond pad directly connected to the BTSV, the size of the conductive bond pad can be reduced thereby improving a routing capability of the conductive bond pad.

FIG. 1 illustrates some embodiments of an integrated chip 100 having a back-side bond pad.

The integrated chip 100 comprises a semiconductor substrate 102 having a front-side 102f and a back-side 102b. A plurality of semiconductor devices 104 (e.g., transistor devices) are arranged along the front-side 102f of the semiconductor substrate 102. A back-end-of-the line (BEOL) metallization stack is arranged over the front-side 102f of the semiconductor substrate 102 and comprises a plurality of metal interconnect layers 106 arranged within an inter-level dielectric (ILD) structure 108. The plurality of metal interconnect layers 106 are electrically coupled to the plurality of semiconductor devices 104, and may increase in size (e.g., width and/or height) as a distance from the front-side 102f of the semiconductor substrate 102 increases (e.g., from a thin 'M1' layer to a thicker 'Mx' layer, where x>1).

A conductive bond pad 112 is arranged along the back-side 102b of the semiconductor substrate 102. The conductive bond pad 112 has a front-side 112f facing the semiconductor substrate 102 and a back-side 112b facing away from the semiconductor substrate 102. The front-side 112f of the conductive bond pad 112 is separated from the semiconductor substrate 102 by way of one or more dielectric layers 114 and may comprise a planar surface that extends along an interface with the one or more dielectric layers 114.

A back-side through-substrate-via (BTSV) 110 extends through the semiconductor substrate 102 from a metal interconnect layer 106 within the BEOL metallization stack to the front-side 112f of the conductive bond pad 112. The BTSV 110 protrudes outward from the back-side 102b of the semiconductor substrate 102 through the one or more dielectric layers 114. The BTSV 110 has a relatively small size (e.g., less than or equal to approximately 2.5 um) that allows for the BTSV 110 to connect to a thin metal interconnect layer that is arranged below a top metal interconnect layer (i.e., a layer furthest from the semiconductor substrate 102) of the BEOL metallization stack.

The back-side 112b of the conductive bond pad 112 is covered by a passivation layer 116. An under bump metallurgy (UBM) layer 118 extends through an opening in the passivation layer 116 to contact the back-side 112b of the conductive bond pad 112. In some embodiments, the UBM layer 118 may also extend along an upper surface of the passivation layer 116. A conductive bump 120 is arranged within the UBM layer 118 at a position that is separated from the passivation layer 116 by the UBM layer 118. The conductive bump 120 is configured to provide an electrical connection between the semiconductor devices 104 and an external device (e.g., a PCB, another integrated chip, etc.). In some embodiments, the UBM layer 118 is arranged over the conductive bond pad 112 at a location that is laterally offset from the BTSV 110.

By connecting the BTSV 110 directly between a metal interconnect layer 106 and the front-side 112f of the conductive bond pad 112, a width of the conductive bond pad 112 can be decreased (e.g., since a redistribution layer is not used). Decreasing a width of the conductive bond pad 112 allows for increased flexibility in routing of the conductive bond pad 112, and improves performance (e.g., due to a shorter path between the semiconductor devices 104 and the conductive bond pad 112).

Figure 2:
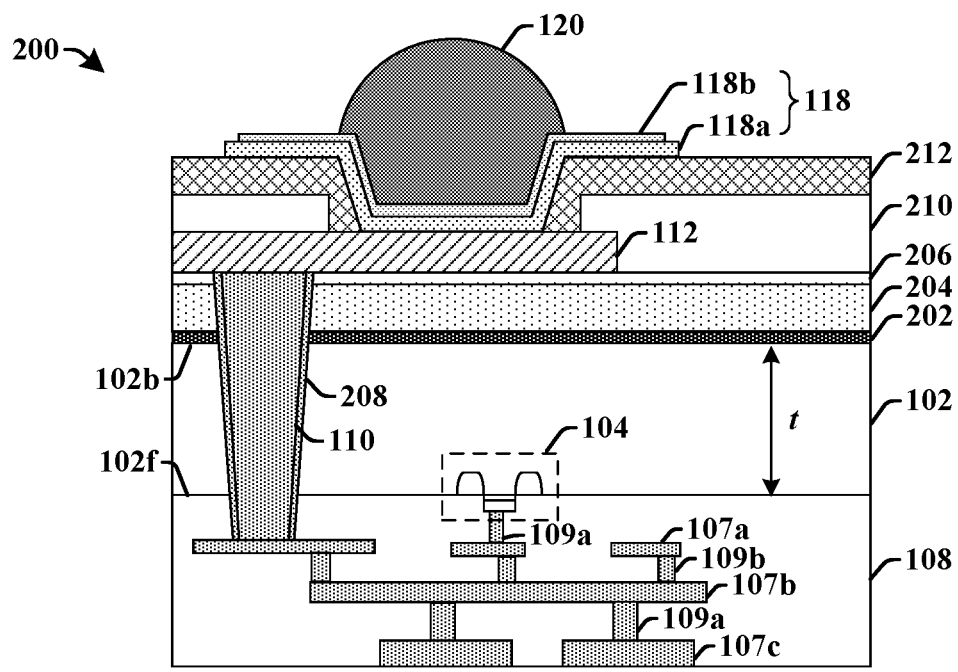
FIG. 2 illustrates some additional embodiments of an integrated chip having a back-side bond pad.

FIG. 2 illustrates some alternative embodiments of an integrated chip 200 having a back-side bond pad.

The integrated chip 200 comprises a semiconductor substrate 102 and an overlying BEOL metallization stack. In some embodiments, the semiconductor substrate 102 has a thickness t that is between approximately 1 um and approximately 10 um. A plurality of semiconductor devices 104 may be arranged within a front-side 102f of the semiconductor substrate 102.

The BEOL metallization stack comprises a plurality of metal interconnect layers arranged within an inter-level dielectric (ILD) structure 108. In some embodiments, the plurality of metal interconnect layers may comprise a plurality of metal wires 107a-107c disposed between a plurality of contacts 109a and/or metal vias 109b-109c. The plurality of metal interconnect wires may increase in size from a thin, first metal wires 107a to thicker metal wires, 107b and/or 107c, which are separated from the semiconductor substrate 102 by the thin, first metal wires 107a. In some embodiments, the first metal wires 107a may have a thickness of less than approximately 70 nm. In some other embodiments, the first metal wires 107a may have a thickness of less than approximately 30 nm. In various embodiments, the plurality of metal interconnect layers may comprise a conductive material such as copper, aluminum, tungsten, or a combination thereof. In various embodiments, the ILD structure 108 may comprise one or more of an oxide, an ultra-low k dielectric material, or a low-k dielectric material (e.g., SiCO).

A high-k dielectric layer 202 is arranged onto a back-side 102b of the semiconductor substrate 102. The high-k dielectric layer 202 is configured to reduce a roughness of the back-side 102b of the semiconductor substrate 102 after it has been thinned during processing. By reducing the roughness of the back-side 102b of the semiconductor substrate 102, device leakage is reduced. The high-k dielectric layer 202 is rougher (e.g., has a greater variation in vertical position) on a side facing the semiconductor substrate 102 than on an opposing side facing away from the semiconductor substrate 102. In various embodiments, the high-k dielectric layer 202 may comprise one or multiple layers. In some embodiments, the high-k dielectric layer 202 has a thickness $t_2$ that is in a range of between approximately 10 angstroms and approximately 1,000 angstroms. In some embodiments, the high-k dielectric layer 202 may comprise aluminum oxide ($Al_2O_3$), tantalum oxide ($Ta_2O_5$), titanium oxide ($TiO_2$), zirconium oxide ($ZrO_2$), hafnium oxide (HfO), hafnium silicon oxide (HfSiO), hafnium aluminum oxide (HfAlO), and/or hafnium tantalum oxide (HfTaO), for example.

A dielectric layer 204 is arranged over the high-k dielectric layer 202. In various embodiments, the dielectric layer 204 may comprise an oxide (e.g., $SiO_2$). In some embodiments, a buffer layer 206 may be arranged over the dielectric layer 204. The buffer layer 206 may comprise a nitride (e.g., SiN, $Si_3N_4$). A conductive bond pad 112 is arranged over the dielectric layer 204 and/or the buffer layer 206. The conductive bond pad 112 comprises a planar structure arranged along an upper surface of the dielectric layer 204 and/or the buffer layer 206. In some embodiments, the conductive bond pad 112 may comprise aluminum, for example.

A back-side through-substrate-via (BTSV) 110 extends from the BEOL metallization stack, through the semiconductor substrate 102, the high-k dielectric layer 202, the dielectric layer 204, and the buffer layer 206, to a front-side 112f of the conductive bond pad 112. In some embodiments, the BTSV 110 may be connected between the conductive bond pad 112 and the thin, first metal wire 107a (e.g., an 'M1' layer that is closest to the front-side 102f of the semiconductor substrate 102). In some embodiments, the BTSV 110 may have an upper surface that is co-planar with an upper surface of the dielectric layer 204 or the buffer layer 206. In some embodiments, the BTSV 110 may have tapered sidewalls that extend between the thin, first metal wire 107a and the conductive bond pad 112. In some embodiments, the tapered sidewalls may have a smooth surface (e.g., with a constant slope) transitioning between the semiconductor substrate 102 and the high-k dielectric layer 202. The tapered sidewalls cause a width of the BTSV 110 to increase from the front-side 102f of the semiconductor substrate 102 to the back-side of the semiconductor substrate 102. In various embodiments, the BTSV 110 may comprise copper, aluminum, tungsten, or a similar material.

In some embodiments, a BTSV liner 208 is arranged along sidewalls of the BTSV 110. The BTSV liner 208 separates the BTSV 110 from the semiconductor substrate 102. In various embodiments, the BTSV liner 208 may comprise an oxide or a silicon nitride, for example. In some embodiments, the BTSV liner 208 may also extends along sidewalls of the high-k dielectric layer 202, the dielectric layer 204, and the buffer layer 206.

One or more passivation layers, 210 and 212, may be arranged over the conductive bond pad 112. The one or more passivation layers, 210 and 212, extend over the conductive bond pad 112 and along sidewalls of the conductive bond pad 112. In some embodiments, the passivation layers may comprise a dielectric layer 210 and a polyimide layer 212. An under-bump metallurgy (UBM) layer 118 is arranged on an upper surface of the conductive bond pad 112, and lines an interior of an opening in the polyimide layer 212. The UBM layer 118 may comprise a stack of different metal layers, 118a and 118b, serving as a diffusion layer, a barrier layer, a wetting layer, and/or an anti-oxidation layer. In some embodiments, the UBM layer 118 may comprise copper, copper alloys, aluminum, aluminum alloys, or the like. In various embodiments, the conductive bond pad 112 has a planar lower surface abutting the dielectric layer 204 and/or the buffer layer 206 between the BTSV 110 and the UBM layer 118. In some embodiments, the UBM layer 118 may further extend along an upper surface of the polyimide layer 212.

A conductive bump 120 is arranged on the UBM layer 118. In some embodiments, the conductive bump 120 is a solder bump, a copper bump, a metal bump including nickel (Ni) or gold (Au), or combinations thereof. In some embodiments, the conductive bump 120 is a solder bump formed by placing solder balls on the UBM layer 118 and then reflowing the solder balls. In some embodiments, the solder bump includes a lead-free pre-solder layer, SnAg, or a solder material including alloys of tin, lead, silver, copper, nickel, bismuth, or combinations thereof.

Figure 3:
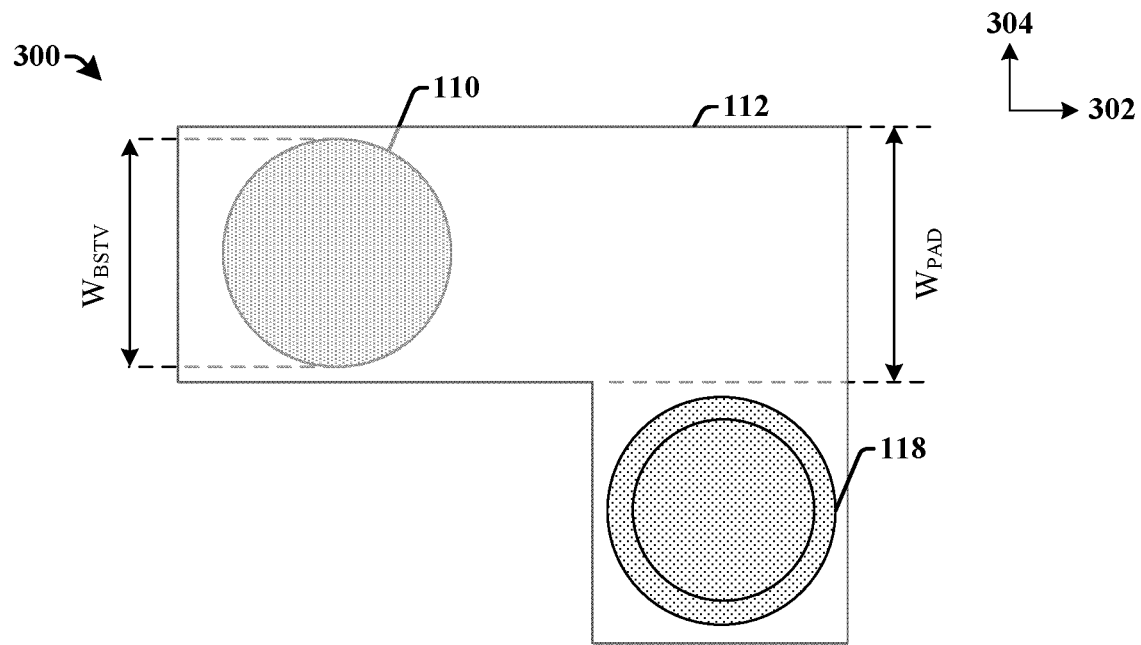
FIG. 3 illustrates some embodiments of a top-view of a conductive bond pad connected to a back-side through substrate via (BTSV).

FIG. 3 illustrates a top-view 300 of some embodiments of a back-side through-substrate-via (BTSV) directly contacting a conductive bond pad.

As shown in top-view 300, a BTSV 110 contacts a first end of the conductive bond pad 112. In some embodiments, the BTSV 110 may have a circular cross-section. In other embodiments the BTSV 110 may have a cross-section with an alternative shape. An under-bump metallurgy (UBM) layer 118 contacts a second end of the conductive bond pad 112 at a position laterally offset from the BTSV 110. In some embodiments, the BTSV 110 may have a width $w_{BTSV}$ in a range of between approximately 0.3 um and approximately 5 um.

In some embodiments, the BTSV 110 is covered by the conductive bond pad 112. Since the BTSV 110 is covered by the conductive bond pad 112, the size of the BTSV 110 may affect the size of the conductive bond pad 112. For example, in some such embodiments, the BTSV 110 may have a width $w_{BTSV}$ of less than or equal to approximately 1.5 um and the conductive bond pad 112 may have a width $w_{Pad}$ that is less than or equal to approximately 2.5 um. In other such embodiments, the BTSV 110 may have a width $w_{BTSV}$ of less than or equal to approximately 1 um and the conductive bond pad 112 may have a width $w_{Pad}$ that is less than or equal to approximately 2.0 um. In such embodiments, a BSTV having a width $w_{BTSV}$ of less than approximately 2.5 um result in a relatively small conductive bond pad width $w_{Pad}$ that provides for design freedom and room for conductive bond pad routing.

In some embodiments, the conductive bond pad 112 may extend in multiple directions. For example, the conductive bond pad 112 may extend in a first direction 302 and a second direction 304, which is perpendicular to the first direction 302. In some such embodiments, the BTSV 110 may contact a segment of the conductive bond pad 112 extending in the first direction 302, while the UBM layer 118 may contact a segment of the conductive bond pad 112 extending in the second direction 304. In other such embodiments, the BTSV 110 and the UBM layer 118 may contact segments of the conductive bond pad 112 extending in the first direction 302, which are separated by one or more segment of the conductive bond pad 112 extending in the second direction 304.

Figure 4:
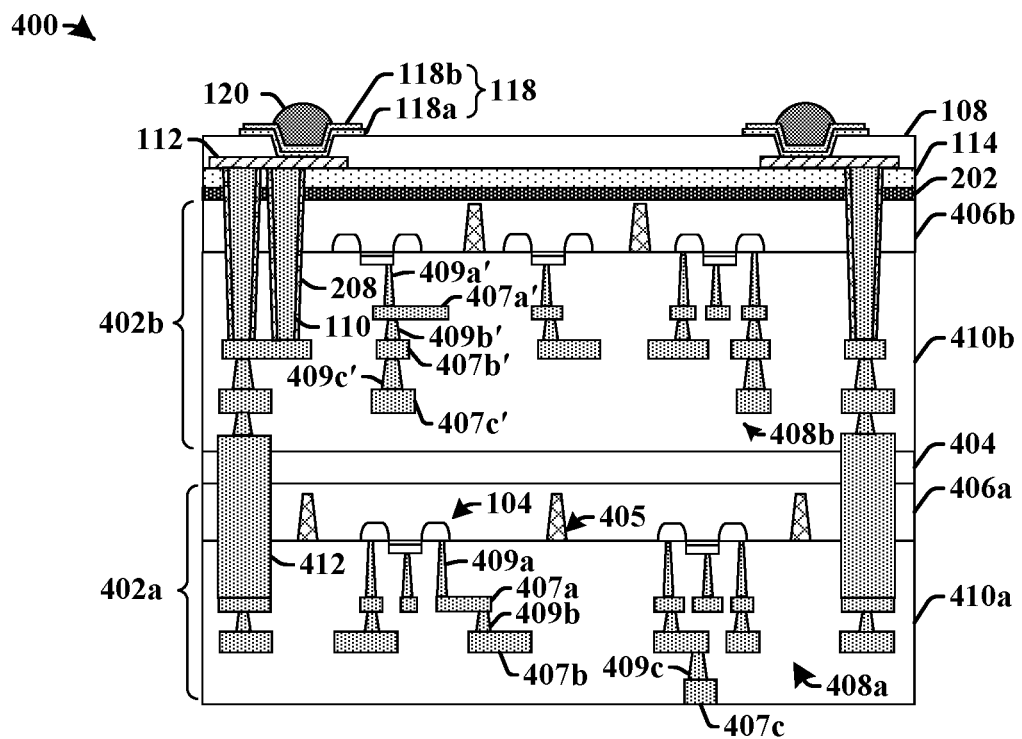
FIG. 4 illustrates some embodiments of a three-dimensional integrated chip (3DIC) having a back-side bond pad.

FIG. 4 illustrates some alternative embodiments of a three-dimensional integrated chip (3D-IC) 400 having a back-side conductive bond pad.

The 3D-IC 400 comprises a first semiconductor die 402a coupled to a second semiconductor die 402b by way of an adhesion layer 404 disposed therebetween. The first semiconductor die 402a comprises a first semiconductor substrate 406a having a plurality of semiconductor devices 104. In some embodiments, the plurality of semiconductor devices 104 may be separated by isolation structures 405 (e.g., shallow trench isolation structures). A first plurality of metal interconnect layers 408a are arranged within a first ILD structure 410a comprising one or more ILD layers overlying the first semiconductor die 402a. The second semiconductor die 402b comprises a second semiconductor substrate 406b and a second plurality of metal interconnect layers 408b arranged within a second ILD structure 410b comprising one or more ILD layers. In some embodiments, the adhesion layer 404 comprises an oxide layer, so that the first semiconductor die 402a is connected to the second semiconductor die 402b along an interface between oxide layers.

The plurality of metal interconnect layers 408 comprise metal wires 409 and metal contacts and/or vias 407. The first plurality of metal interconnect layers 408a comprise thin metal wires 409a and thick metal wires 409b that have a greater size (e.g., width and/or height) than the thin metal wires 409a. The thick metal wires 409b are separated from the first semiconductor substrate 406a by way of one or more of the thin metal wires 409a. The second plurality of metal interconnect layers 408b also comprise thin metal wires 409a' and thick metal layers 409b' having a greater size than the thin metal wires 409a'. The thick metal wires 409b' are separated from the second semiconductor substrate 406b by way of one or more of the thin metal wires 409a'.

A through dielectric via (TDV) 412 extends from the first plurality of metal interconnect layers 408a, though the first semiconductor substrate 406a and the adhesion layer 404 to one of the second plurality of metal interconnect layers 408b. In some embodiments, the TDV 412 connects a thick metal layer 407b within the first plurality of metal interconnect layers 408a to a thick metal layer 407c' within the second plurality of metal interconnect layers 408b.

A BTSV 110 is connected to a thin metal layer 407a' of the second plurality of metal interconnect layers 408b (e.g., a thin metal layer 407a' arranged between a thick metal layer 407b' and the second semiconductor substrate 406b). The BTSV 110 extends through the second semiconductor substrate 406b to a planar conductive bond pad 112 arranged along a back-side of the second semiconductor substrate 406b. The planar conductive bond pad 112 is further connected to a UBM layer 118 that is connected to a conductive bump 120. In some embodiments, more than one BTSV 110 may be connected in parallel between the thin metal layer 407a' and the conductive bond pad 112.

FIGS. 5-15 illustrate some embodiments of cross-sectional views 500-1500 showing a method of forming an integrated chip having a back-side bond pad.

As shown in cross-section view 500, a semiconductor substrate 502 is provided. The semiconductor substrate 502 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate 502 may comprise an intrinsically doped semiconductor substrate having a first doping type (e.g., an n-type doping or a p-type doping).

A plurality of semiconductor devices 104 (e.g., transistor devices) are formed along a front-side 502f of the semiconductor substrate 502. In some embodiments, the plurality of semiconductor devices 104 are formed by forming a gate structure over the semiconductor substrate 502. The gate structure may be formed by forming a gate dielectric layer 104e onto the semiconductor substrate 502, and subsequently forming a gate electrode layer 104g over the gate dielectric layer 104e. The gate dielectric layer 104e and the gate electrode layer 104g are subsequently patterned according to a photolithography process to form a gate structure. Source and drain regions, 104s and 104d, may be formed by an epitaxial process or by an implantation process that selectively implants the semiconductor substrate 502 with a dopant species, such as boron (B) or phosphorous (P), for example. The dopant species may be subsequently driven into the semiconductor substrate 502 by a high temperature thermal anneal.

As shown in cross-section view 600, a BEOL metallization stack is formed over the front-side 502f of the semiconductor substrate 502. The BEOL metallization stack comprises a plurality of metal interconnect layers 106, which are formed within an ILD structure 108 arranged over the front-side 502f of the semiconductor substrate 502, and that are connected to the plurality of semiconductor devices 104.

In some embodiments, the BEOL metallization stack is formed by depositing individual ILD layers 108a-108d using separate deposition processes. Via holes and/or metal trenches are etched into one of the individual ILD layers 108a-108d after its deposition. A conductive material (e.g., copper, tungsten, and/or aluminum) is deposited within the via holes and/or metal trenches to form metal interconnect layers 106. In some embodiments, a deposition process may be used to form a seed layer within the via holes, followed by a subsequent plating process (e.g., an electroplating process, an electro-less plating process) that forms the metal material to a thickness that fills the via holes and/or metal trenches. In some embodiments, a chemical mechanical polishing (CMP) process may be used to remove excess of the metal material from a top surface of the individual ILD layers 108a-108d. In various embodiments, the plurality of metal interconnect layers may be formed by a dual damascene process (shown) or a single damascene process (not shown).

As shown in cross-section view 700, a thickness of the semiconductor substrate 502 is reduced. Reducing the thickness of the semiconductor substrate 502 allows for a subsequently formed back-side through-substrate-via (BTSV) (e.g., formed in FIGS. 9-11) to have a smaller size (e.g., less than or equal to approximately 2.5 um) that can decrease a size of a conductive bond pad. In some embodiments, the ILD structure 108 may be connected to a carrier substrate (not shown) by way of an adhesive material, prior to thinning the semiconductor substrate 502. The carrier substrate provides support during the thinning and subsequent processing. The semiconductor substrate 502 may be thinned by an etching process and/or by mechanically grinding the back-side 502b of the semiconductor substrate 502. In some embodiments, the substrate thickness is reduced from a first thickness $t_1$ of approximately 700 um to a second thickness $t_2$ in a range of between approximately 1 um and 10 um.

As shown in cross-section view 800, a high-k dielectric layer 202 is formed over the back-side 102b of the semiconductor substrate 102. In various embodiments, the high-k dielectric layer 202 may comprise aluminum oxide ($Al_2O_3$), tantalum oxide ($Ta_2O_5$), titanium oxide ($TiO_2$), zirconium oxide ($ZrO_2$), and/or hafnium oxide (HfO), for example. In various embodiments, the high-k dielectric layer 202 may be formed by a deposition process (e.g., CVD, PE-CVD, ALD, PVD, etc.). The high-k dielectric layer 202 reduces a roughness of the back-side 102b of the semiconductor substrate 102, thereby improving device leakage.

A dielectric layer 204 and/or a buffer layer 206 are subsequently formed over the high-k dielectric layer 202. In some embodiments, the dielectric layer 204 may comprise an oxide layer and the buffer layer 206 may comprise a nitride layer. The dielectric layer 204 and/or the buffer layer 206 may be formed by way of deposition processes (e.g., CVD, PE-CVD, ALD, PVD, etc.).

As shown in cross-section view 900, a BTSV opening 902 is formed. The BTSV opening 902 vertically extends through the dielectric layer 204 and/or the buffer layer 206, the high-k dielectric layer 202, the semiconductor substrate 102, and a part of the ILD structure 108, to a position contacting a thin, first metal wire 107a of the plurality of metal interconnect layers 106. In some embodiments, the BTSV opening 902 may be formed by selectively exposing the substrate to an etchant 904 according to a masking layer 906. In various embodiments, the masking layer 906 may comprise photoresist or a nitride (e.g., $Si_3N_4$, SiN) patterned using a photolithography process. In various embodiments, the etchant 904 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

As shown in cross-section view 1000, a BTSV liner 1002 may be formed within the BTSV opening 902. The BTSV liner 1002 extends along a lower surface and sidewalls of the BTSV opening 902. In some embodiments, the BTSV liner 1002 may be confined to within the BTSV opening 902, while in other embodiments, the BTSV liner 1002 may extend outward from the BTSV opening 902 to over the dielectric layer 204 and/or the buffer layer 206. In some embodiments, the BTSV liner 1002 may be formed by way of a deposition process (e.g., CVD, PE-CVD, ALD, PVD, etc.). In other embodiments, the BTSV liner 1002 may be formed by way of a thermal oxidation process. In such embodiments, the BTSV liner 1002 may not extend over the dielectric layer 204 and/or the buffer layer 206 (i.e., the BTSV liner 208 may have an upper surface below an upper surface of the dielectric layer 204 and/or the buffer layer 206). In some embodiments, the BTSV liner 1002 may comprise an oxide (e.g., $SiO_2$).

The BTSV opening 902 is subsequently filled with a conductive material 1004. In various embodiments, the conductive material 1004 may comprise copper, aluminum, tungsten, or a similar material. In some embodiments, the conductive material 1004 may be formed by way of a deposition process. In some additional embodiments, the conductive material 1004 may be formed by way of a plating process (e.g., an electroplating process or an electro-less plating process). The conductive material 1004 fills the BTSV opening 902 and extends over an upper surface of the dielectric layer 204 and/or the buffer layer 206.

As shown in cross-section view 1100, a planarization process is performed along line 1102 to remove the conductive material (e.g., 1004 of FIG. 10) and/or the BTSV liner (e.g., 1002 of FIG. 10) overlying the dielectric layer 204 and/or the buffer layer 206. The planarization process forms a planar surface 1104 extending along the BTSV 110 and the dielectric layer 204 and/or the buffer layer 206. The planarization process confines the BTSV 110 and/or the BTSV liner 208 to within the BTSV opening 902. In some embodiments, the planarization process may comprise a chemical mechanical polishing (CMP) process. In other embodiments, the planarization process may comprise an etching process and/or a grinding process, for example.

As shown in cross-section view 1200, a conductive bond pad 112 is formed onto the planar surface 1104. The conductive bond pad 112 is formed directly in contact with the BTSV 110 so that the BTSV 110 is in physical and electrical contact with the conductive bond pad 112. The conductive bond pad 112 may be formed by a deposition process and/or a plating process followed by lithographic patterning and etching processes.

As shown in cross-section view 1300, one or more passivation layers, 210 and 212, are formed over the conductive bond pad 112. The one or more passivation layers, 210 and 212, extend from over the conductive bond pad 112 to over the dielectric layer 204 and/or the buffer layer 206. In some embodiments, the one or more passivation layers may comprise a dielectric layer 210 and a polyimide layer 212. The one or more passivation layers may be formed by a deposition process, followed by a patterning process that forms a UBM opening 1302 that extend through the one or more passivation layers to a back-side 112b of the conductive bond pad 112.

As shown in cross-section view 1400, an under bump metallurgy (UBM) layer 118 is formed within the UBM opening 1302. The UBM layer 118 is a stack of different metal layers, 118a and 118b, which serve as a diffusion layer, a barrier layer, a wetting layer, and/or an anti-oxidation layer. The UBM layer 118 may be formed by successive deposition processes.

As shown in cross-section view 1500, a conductive bump 120 is formed on the UBM layer 118. In various embodiments, the conductive bump 120 may comprise a solder bump, a copper bump, a metal bump including nickel (Ni) or gold (Au), or combinations thereof. In some embodiments, the integrated chip may be brought into contact with a substrate (e.g., printed circuit board) or lead frame of a package, and then the solder ball is reflowed to form an electrical connection with the substrate or lead frame. After the integrated chip is electrically connected to the substrate or lead frame, the carrier substrate and adhesive layer may be removed.

Figure 15:
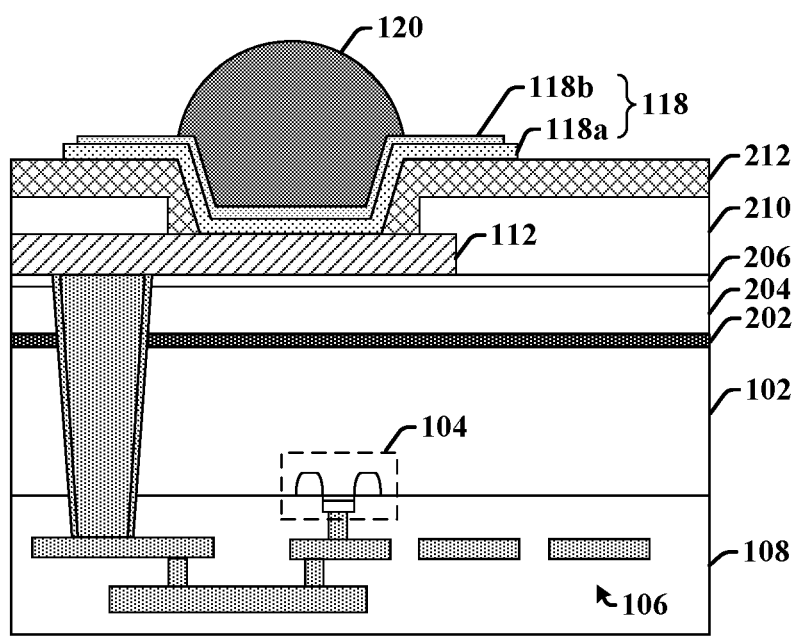
Figure 16:
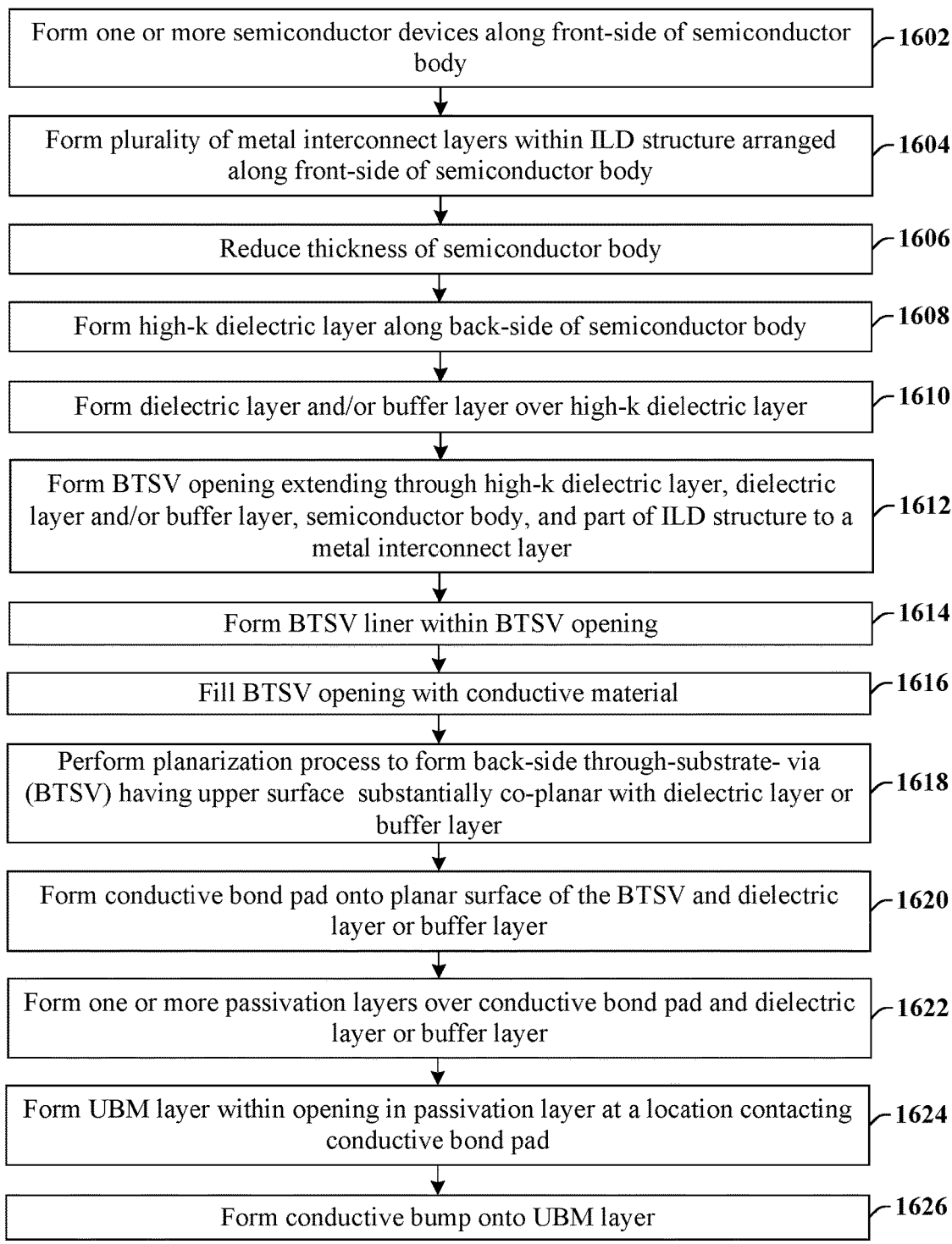
FIG. 16 illustrates a flow diagram of some embodiments of a method of forming an integrated chip having a back-side bond pad.

FIG. 16 illustrates a flow diagram of some embodiments of a method of forming an integrated chip having a back-side bond pad. Although method 1600 is described in relation to FIGS. 5-15, it will be appreciated that the method 1600 is not limited to such structures, but instead may stand alone as a method independent of the structures.

While the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
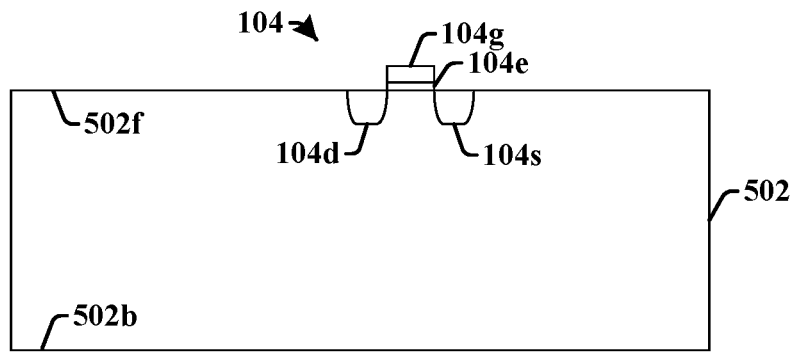
FIGS. 5-15 illustrate some embodiments of cross-sectional views showing a method of forming an integrated chip having a back-side bond pad.

At 1602, one or more semiconductor devices are formed along a front-side of a semiconductor substrate. FIG. 5 illustrates some embodiments corresponding to act 1602.

Figure 6:
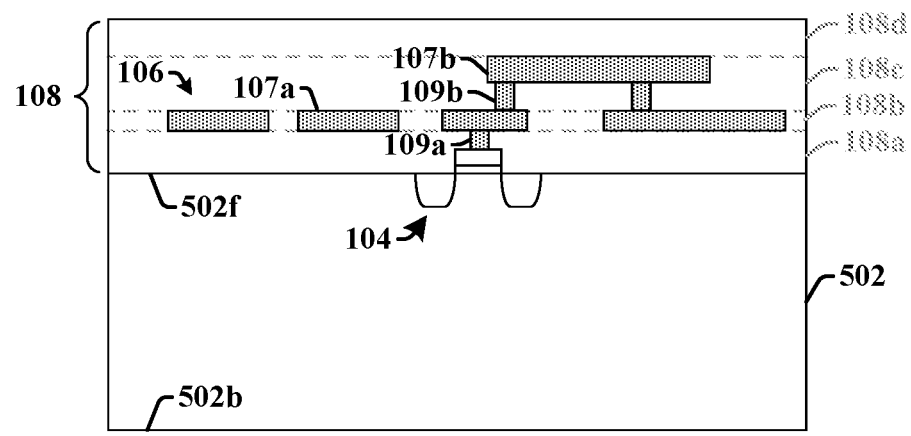

At 1604, a plurality of metal interconnect layers are formed within an inter-level dielectric (ILD) structure arranged along the front-side of the semiconductor substrate. FIG. 6 illustrates some embodiments corresponding to act 1604.

Figure 7:
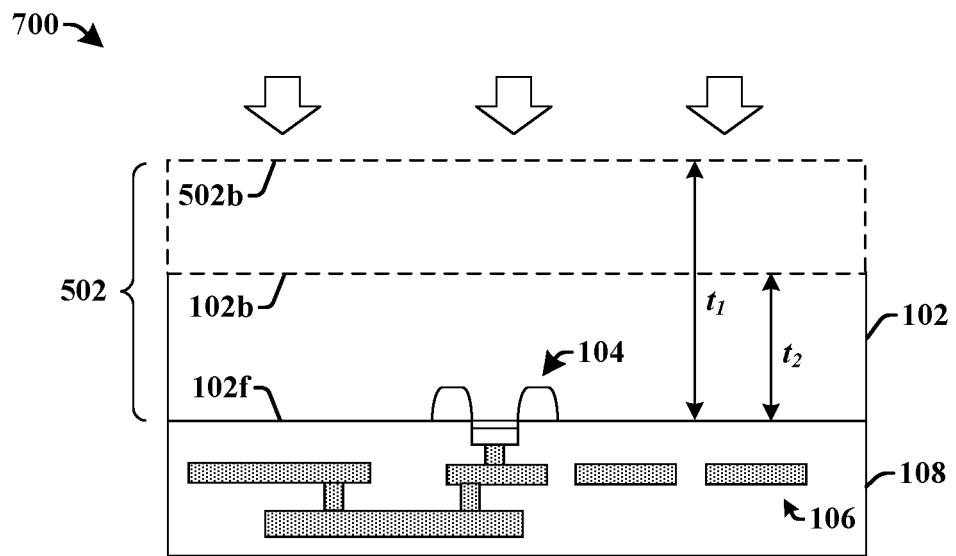

At 1606, a thickness of the semiconductor substrate is reduced. FIG. 7 illustrates some embodiments corresponding to act 1606.

Figure 8:
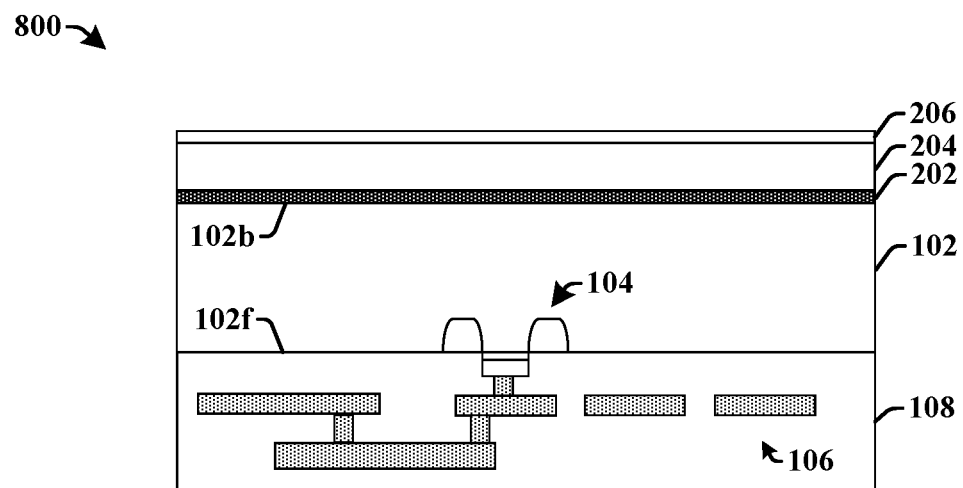

At 1608, a high-k dielectric layer is formed along a back-side of the semiconductor substrate. FIG. 8 illustrates some embodiments corresponding to act 1608.

At 1610, a dielectric layer and/or a buffer layer are formed over the high-k dielectric layer. FIG. 8 illustrates some embodiments corresponding to act 1610.

Figure 9:
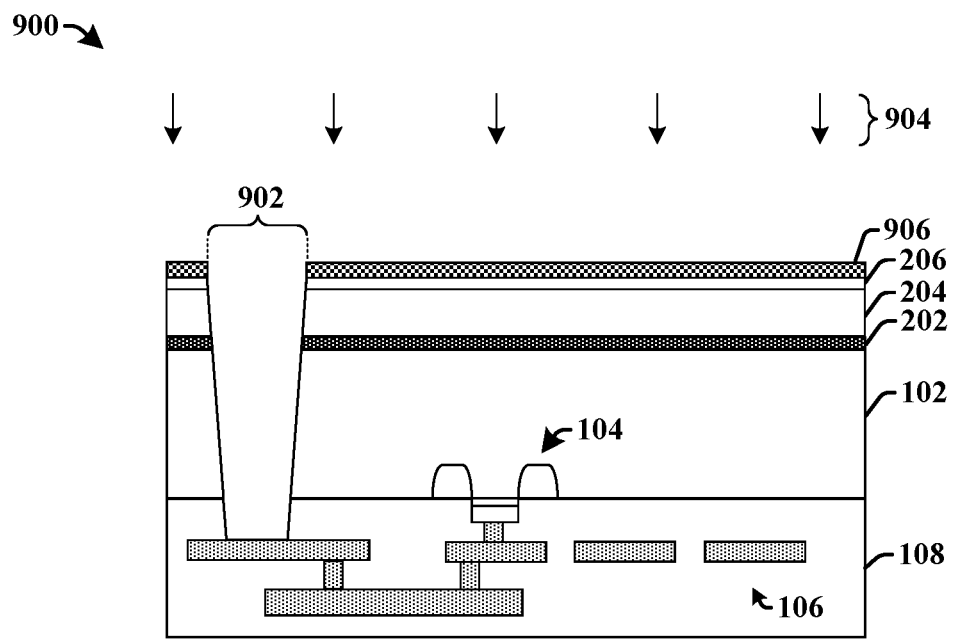

At 1612, a back-side through-substrate-via (BTSV) opening is formed. The BTSV opening extends through the dielectric layer and/or the buffer layer, the high-k dielectric layer, the semiconductor substrate, and a part of the ILD structure. The BSTV may contact a thin metal interconnect wire, which is disposed between the substrate and thicker metal interconnect wires. FIG. 9 illustrates some embodiments corresponding to act 1612.

Figure 10:
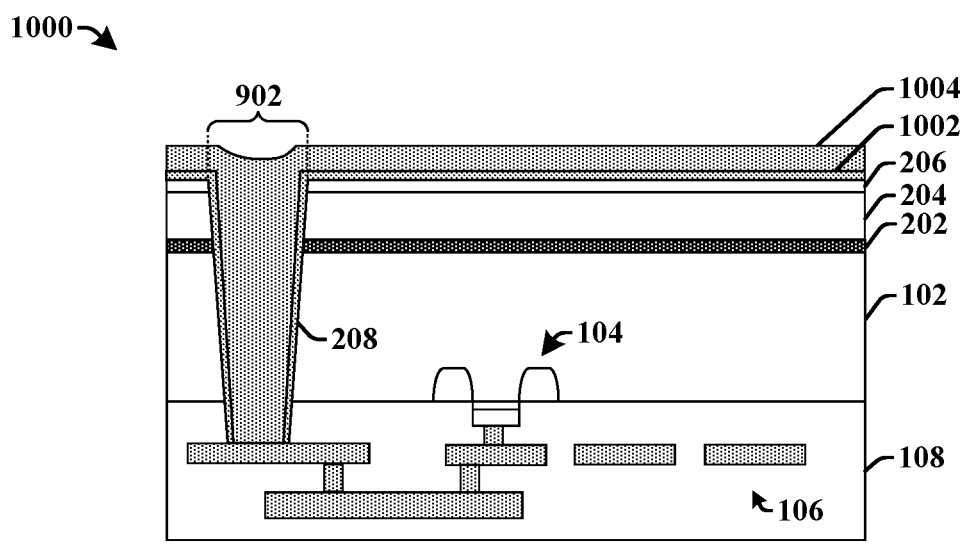

At 1614, a BTSV liner may be formed within the BTSV opening. FIG. 10 illustrates some embodiments corresponding to act 1614.

At 1616, the BTSV opening is filled with a conductive material. FIG. 10 illustrates some embodiments corresponding to act 1616.

Figure 11:
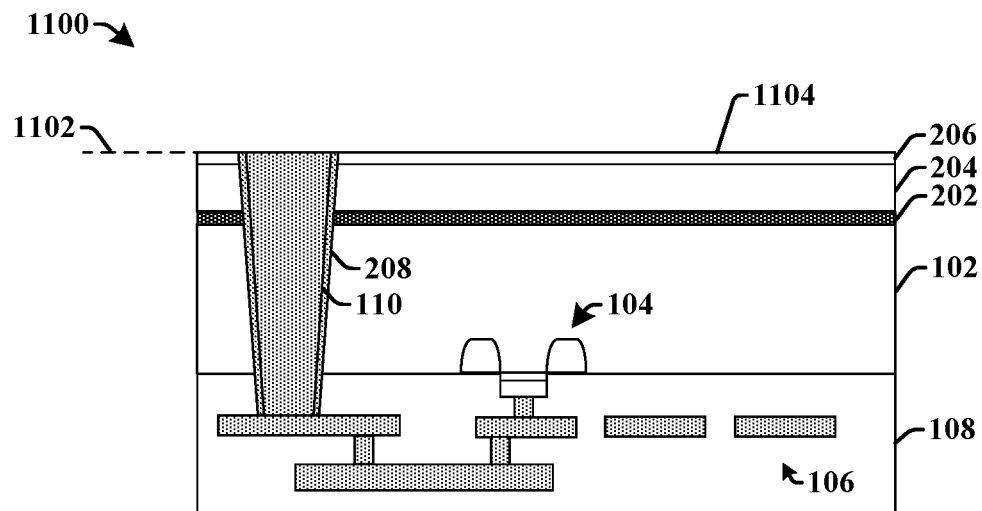

At 1618, a planarization process is performed to form a BTSV having an upper surface that is substantially co-planar with the dielectric layer or the buffer layer. FIG. 11 illustrates some embodiments corresponding to act 1618.

Figure 12:
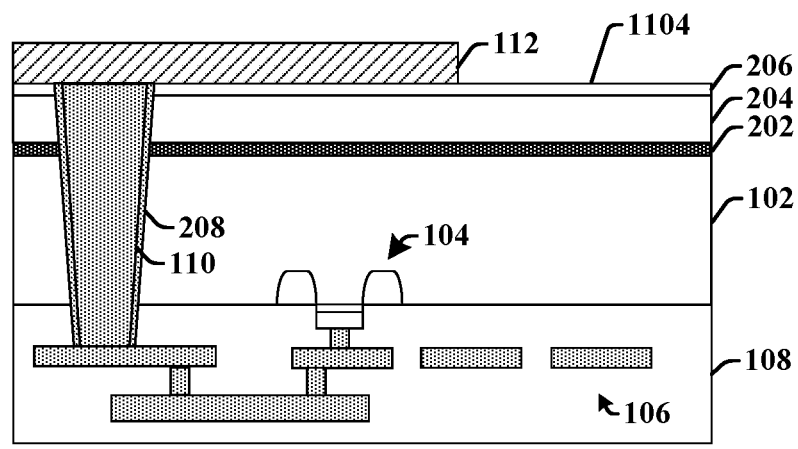

At 1620, a conductive bond pad is formed onto a planar surface of the BTSV the dielectric layer or the buffer layer. FIG. 12 illustrates some embodiments corresponding to act 1620.

Figure 13:
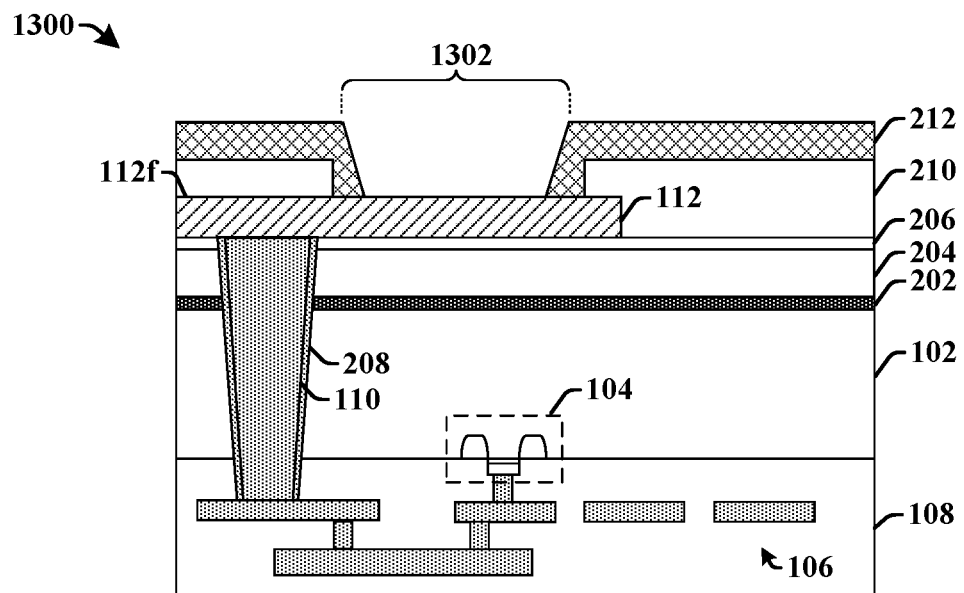

At 1622, one or more passivation layers are formed over the conductive bond pad and the dielectric layer or the buffer layer. FIG. 13 illustrates some embodiments corresponding to act 1622.

Figure 14:
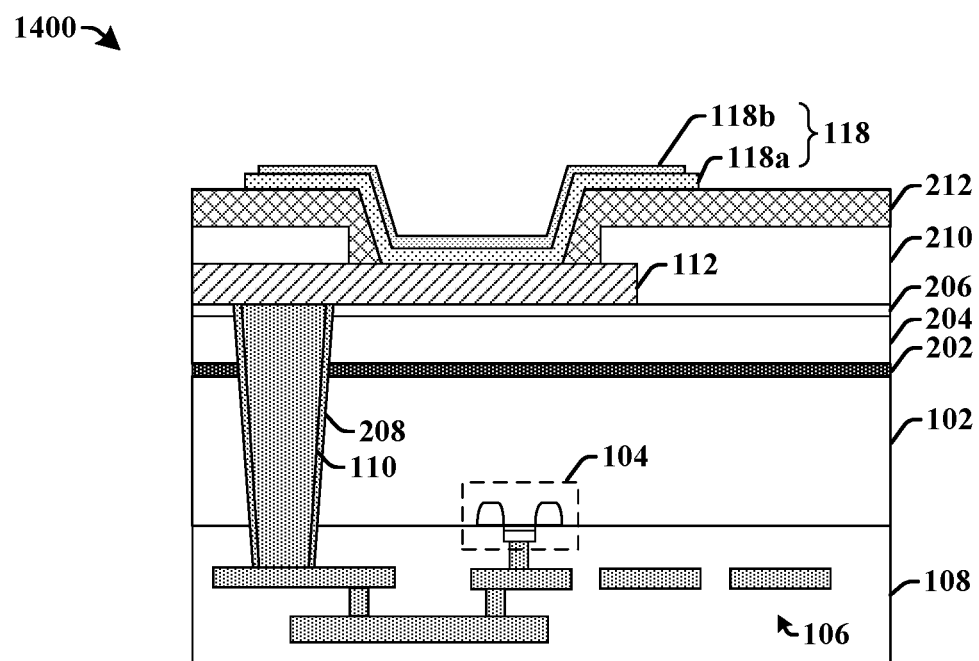

At 1624, an under bump metallurgy (UBM) layer is formed within an opening in the passivation layer at a location contacting the conductive bond pad. FIG. 14 illustrates some embodiments corresponding to act 1624.

At 1626, a conductive bump is formed on the UBM layer. FIG. 15 illustrates some embodiments corresponding to act 1626.

Therefore, the present disclosure relates to an integrated chip (IC) having a back-side through-silicon-via (BTSV) with a direct physical connection between a metal interconnect layer and a back-side conductive bond pad.

In some embodiments, the present disclosure relates to an integrated chip. The integrated chip comprises a plurality of metal interconnect layers arranged within an inter-level dielectric (ILD) structure disposed along a front-side of a substrate. A dielectric layer is arranged along a back-side of the substrate, and a conductive bond pad is arranged over the dielectric layer. A back-side through-substrate-via (BTSV) extends from one of the plurality of metal interconnect layers through the substrate and the dielectric layer to the conductive bond pad. A conductive bump is arranged over the conductive bond pad. The conductive bond pad has a substantially planar lower surface extending from over the BTSV to below the conductive bump.

In other embodiments, the present disclosure relates to an integrated chip. The integrated chip comprises a plurality of metal interconnect layers arranged within an inter-level dielectric (ILD) structure disposed along a front-side of a substrate. The plurality of metal interconnect layers comprise a first metal interconnect wire and a thicker, second metal interconnect wire that is separated from the substrate by the first metal interconnect wire. A high-k dielectric layer arranged onto a back-side of the substrate, and a dielectric layer is separated from the back-side of the substrate by the high-k dielectric layer. A conductive bond pad is arranged over the dielectric layer. A back-side through-substrate-via (BTSV) extend between the wire metal interconnect layer and the conductive bond pad.

In yet other embodiments, the present disclosure relates to a method of forming an integrated chip. The method comprises forming a plurality of metal interconnect layers within an inter-level dielectric (ILD) structure arranged along a front-side of a substrate. The plurality of metal interconnect layers comprise a first metal interconnect wire and a thicker, second metal interconnect wire that is separated from the substrate by the first metal interconnect wire. The method further comprises forming a high-k dielectric layer onto a back-side of the substrate, and forming a dielectric layer over the high-k dielectric layer. The method further comprises etching the dielectric layer, the high-k dielectric layer, the substrate, and the ILD structure to form a back-side through-substrate-via (BTSV) opening that extends to a position in contact with the first metal interconnect wire. The method further comprises depositing a conductive material within the BTSV opening, and performing a planarization process to remove the conductive material outside of the BTSV opening to form a back-side through-substrate-via (BTSV). The method further comprises forming a conductive pad having a planar lower disposed onto the BTSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a first plurality of interconnect layers within a first inter-level dielectric (ILD) structure disposed along a front-side of a first substrate;
   a first conductive pad arranged along a back-side of the first substrate;
   a first through-substrate-via (TSV) extending between an interconnect wire of the first plurality of interconnect layers and the first conductive pad;
   a second plurality of interconnect layers within a second ILD structure disposed along a front-side of a second substrate that faces away from the first substrate, wherein the second ILD structure surrounds one or more transistor gates disposed along the front-side of the second substrate, and wherein the second substrate is bonded to the first substrate by a first dielectric layer disposed along a back-side of the second substrate facing the first substrate; and
   a second TSV extending from an interconnect of the second plurality of interconnect layers to through both the second substrate and the first dielectric layer, wherein the second TSV has a greater width than the first TSV.

2. The integrated chip of claim 1, further comprising:
   a dielectric liner disposed along sidewalls of the first TSV, wherein the dielectric liner laterally separates the first TSV from the first substrate and the first ILD structure.

3. The integrated chip of claim 1, further comprising:
   a first passivation layer disposed directly over and along sidewalls of the first conductive pad, wherein the first passivation layer has a first thickness laterally outside of the first conductive pad and a smaller, second thickness directly over the first conductive pad; and
   a second passivation layer disposed directly over and along sidewalls of the first passivation layer.

4. The integrated chip of claim 1, further comprising:
   an additional TSV extending between the interconnect wire of the first plurality of interconnect layers and the first conductive pad, wherein the first TSV and the additional TSV contact a lower surface of the first conductive pad.

5. The integrated chip of claim 1, further comprising:
   a passivation layer disposed over the first conductive pad;
   an under bump metallurgy (UBM) layer disposed along sidewalls of the passivation layer and directly contacting an upper surface of the first conductive pad at a location that is completely outside of the first TSV; and
   a conductive bump disposed onto the UBM layer.

6. The integrated chip of claim 1, further comprising:
   a second conductive pad arranged along the back-side of the first substrate; and
   a passivation layer disposed over the first conductive pad and the second conductive pad, wherein the passivation layer has an uppermost surface that continuously extends from directly over the first conductive pad to directly over the second conductive pad.

7. The integrated chip of claim 1, wherein the first conductive pad directly contacts a second dielectric layer arranged along the back-side of the first substrate and wherein the first TSV extends through the second dielectric layer.

8. The integrated chip of claim 7, wherein the first TSV has a different shape than the second TSV as viewed along a cross-sectional view.

9. An integrated chip, comprising:
a plurality of interconnect layers arranged within an inter-level dielectric (ILD) structure disposed along a front-side of a substrate;
a conductive pad arranged along a back-side of the substrate;
a first through-substrate-via (TSV) extending between an interconnect wire of the plurality of interconnect layers and the conductive pad; and
wherein the conductive pad has a first segment extending in a first direction and a second segment extending outward from a first sidewall of the first segment in a second direction perpendicular to the first direction, the first TSV disposed directly below the first segment and a conductive bump disposed directly over the second segment, and wherein an entirety of the first TSV is laterally offset from the conductive bump by non-zero distances along the first direction and along the second direction, the first direction and the second direction parallel to the front-side of the substrate.

10. The integrated chip of claim 9, further comprising:
a passivation layer arranged over the conductive pad;
an under bump metallurgy (UBM) layer disposed along sidewalls of the passivation layer and contacting an upper surface of the conductive pad; and
wherein the conductive bump is disposed onto the UBM layer and between sidewalls of the passivation layer.

11. The integrated chip of claim 9, further comprising:
an additional TSV extending through the substrate, wherein both the first TSV and the additional TSV contact a lower surface of the conductive pad and an upper surface of the interconnect wire of the plurality of interconnect layers.

12. The integrated chip of claim 11, wherein the interconnect wire of the plurality of interconnect layers continuously extends past opposing outermost sidewalls of both the first TSV and the additional TSV.

13. The integrated chip of claim 9, further comprising:
a second substrate bonded to the substrate; and
a second TSV extending through the second substrate, wherein the second TSV is wider than the first TSV.

14. The integrated chip of claim 9, wherein the first TSV vertically extends past one or more of the plurality of interconnect layers arranged within the ILD structure.

15. A method of forming an integrated chip, comprising:
forming a first plurality of interconnect layers within a first inter-level dielectric (ILD) structure arranged along a front-side of a first substrate;
forming a second plurality of interconnect layers within a second ILD structure arranged along a front-side of a second substrate;
etching the first substrate and the first ILD structure to define a first opening that has a bottom completely defined by an upper surface of an interconnect wire of the first plurality of interconnect layers;
depositing a conductive material within the first opening to form a first through-substrate-via (TSV);
bonding the second substrate to a back-side of the first substrate after depositing the conductive material within the first opening;
etching a back-side of the second substrate and the second ILD structure, after bonding the second substrate to the back-side of the first substrate, to define a second opening exposing an interconnect wire of the second plurality of interconnect layers;
depositing a second conductive material within the second opening to form a second TSV;
depositing aluminum along the back-side of the second substrate and onto the second TSV; and
patterning the aluminum using photolithography and etching processes to define a conductive pad directly contacting the second TSV.

16. The method of claim 15, further comprising:
reducing a thickness of the first substrate prior to etching the first substrate and the first ILD structure to define the first opening.

17. The method of claim 15, wherein the first TSV and the second TSV have different shapes as viewed along a cross-sectional view.

18. The method of claim 15, further comprising:
prior to depositing the second conductive material within the second opening, performing a thermal oxidation process to form a liner along sidewalls of the second substrate defining the second opening.

19. The method of claim 15, further comprising:
depositing aluminum onto the back-side of the second substrate after etching the back-side of the second substrate to define the second opening.

20. The method of claim 15, wherein the interconnect wire of the first plurality of interconnect layers is disposed on a metal interconnect wire layer that is a closest metal interconnect wire layer to the first substrate.

* * * * *